(12) United States Patent
Brewer et al.

(10) Patent No.: US 12,300,529 B2
(45) Date of Patent: May 13, 2025

(54) ALIGNMENT OF TARGETS ON OPPOSITE SIDES OF A SUBSTRATE

(71) Applicant: The Boeing Company, Chicago, IL (US)

(72) Inventors: Peter D. Brewer, Westlake Village, CA (US); Sevag Terterian, Lake Balboa, CA (US); Diego Eduardo Carrasco, Los Angeles, CA (US); Charbel Abijaoude, Newbury Park, CA (US)

(73) Assignee: The Boeing Company, Arlington, VA (US)

( * ) Notice: Subject to any disclaimer, the term of this patent is extended or adjusted under 35 U.S.C. 154(b) by 426 days.

(21) Appl. No.: 17/663,858

(22) Filed: May 18, 2022

(65) Prior Publication Data

US 2023/0377929 A1 Nov. 23, 2023

(51) Int. Cl.
*H01L 21/68* (2006.01)
*H01L 21/48* (2006.01)

(52) U.S. Cl.
CPC .......... *H01L 21/681* (2013.01); *H01L 21/486* (2013.01)

(58) Field of Classification Search
CPC .... H01L 21/681; H01L 21/486; H01L 23/544

USPC ........................................................ 257/797
See application file for complete search history.

(56) References Cited

U.S. PATENT DOCUMENTS

| | | | | |
|---|---|---|---|---|
| 2002/0050591 A1* | 5/2002 | Tandy | ................... | H05K 1/0269 438/18 |
| 2021/0351075 A1* | 11/2021 | Frasca | ................ | H01L 21/30655 |

OTHER PUBLICATIONS

Pal et al., "Front-to-Back Alignment Techniques in Microelectronics/MEMS Fabrication: A Review", American Scientific Publishers, vol. 4, 1-10, Mar. 2006, p. 1-10.

\* cited by examiner

*Primary Examiner* — Quoc D Hoang
(74) *Attorney, Agent, or Firm* — Harrity & Harrity, LLP (57) ABSTRACT

A method to align targets on opposite sides of a substrate includes forming a first via pattern in a protective layer on a first side of the substrate. The substrate includes a second side opposite the first side. The first via pattern is a first pixelated version of a first alignment target. The first alignment target is optically recognizable by an automated alignment system. The method includes etching a plurality of first vias through the substrate to the second side in the first via pattern. The first via pattern is optically recognizable by the automated alignment system as the first alignment target on both the first side and the second side of the substrate.

20 Claims, 7 Drawing Sheets

ALIGNMENT OF TARGETS ON OPPOSITE SIDES OF A SUBSTRATE

TECHNICAL FIELD

The disclosure relates generally to dual-sided substrates, and in particular, to alignment targets on opposing substrate sides.

BACKGROUND

Current computing systems involve dense integrations of a range of different elements, including processors, application specific integrated circuit accelerators, memory devices, high speed input/output devices, network processing devices, and power delivery/power management devices. Three-dimensional integration of the devices provides a performance advancement due to an increase in interconnectivity between constituent elements. The three-dimensional integration involves through-substrate connections that connect circuits on both sides of the substrate. Alignment of connection pads on both sides of the substrate usually involves aligning masks for one side of the substrate to features on the far side of the substrate. A thickness of the substrate often limits an accuracy of the alignment.

Accordingly, those skilled in the art continue with research and development efforts in the field of accurate front-to-back substrate alignment.

SUMMARY

A method to align targets on opposite sides of a substrate is provided herein. The method includes forming a first via pattern in a protective layer on a first side of the substrate. The substrate includes a second side opposite the first side. The first via pattern is a first pixelated version of a first alignment target. The first alignment target is optically recognizable by an automated alignment system. The method includes etching a plurality of first vias through the substrate to the second side in the first via pattern. The first via pattern is optically recognizable by the automated alignment system as the first alignment target on both the first side and the second side of the substrate.

In one or more embodiments, the method further includes forming a second via pattern in the protective layer on the first side of the substrate. The second via pattern is a second pixelated version of a second alignment target. The second alignment target is optically recognizable by the automated alignment system as a local alignment target. The first alignment target is optically recognizable by the automated alignment system as a global alignment target. The method includes etching a plurality of second vias through the substrate to the second side in the second via pattern. The second via pattern is optically recognizable by the automated alignment system as the second alignment target on both the first side and the second side of the substrate.

In one or more embodiments, the method further includes fabricating a first circuit on the first side of the substrate using the first via pattern and the second via pattern at the first side to align the first circuit, and fabricating a second circuit on the second side of the substrate using the first via pattern and the second via pattern at the second side to align the second circuit.

In one or more embodiments of the method, the first circuit is aligned to the second circuit to within 1 micrometers registration accuracy.

In one or more embodiments of the method, the first via pattern is formed by a deep-reactive-ion etch, and the automated alignment system is an automated lithographic stepper responsive to the first via pattern.

In one or more embodiments of the method, the first via pattern is formed by one of an e-beam, a contact lithography, an imprint lithography, a laser-direct write, and a projection stepper.

In one or more embodiments of the method, the first via pattern in the second side replicates the first via pattern in the first side.

In one or more embodiments of the method, the first via pattern in the second side mirrors the first via pattern in the first side.

In one or more embodiments of the method, each of the plurality of first vias has a diameter in a range of approximately 1 micrometer to approximately 6 micrometers at the first side.

In one or more embodiments, the method further includes fabricating a first circuit on the first side, etching one or more third vias through the substrate from the second side to the first side, filling the one or more third vias with a conductor electrically coupled to the first circuit, and fabricating a second circuit electrically coupled to the conductor on the second side.

In one or more embodiments of the method, the substrate is a semiconductor substrate.

A method to align targets on opposite sides of a substrate is provided herein. The method includes forming a first via pattern in a protective layer on a first side of the substrate. The substrate includes a second side opposite the first side, and a thickness. The first via pattern is a first pixelated version of a first alignment target. The first alignment target is optically recognizable by an automated alignment system. The method includes etching a plurality of first vias through the first via pattern into the substrate to less than the thickness of the substrate, and thinning the second side of the substrate to reveal the plurality of first vias in the first via pattern at the second side. The first via pattern is optically recognizable by the automated alignment system as the first alignment target on both the first side and the second side of the substrate.

In one or more embodiments, the method further includes forming a second via pattern in the protective layer on the first side of the substrate. The second via pattern is a second pixelated version of a second alignment target. The second alignment target is optically recognizable by the automated alignment system as a local alignment target. The first alignment target is optically recognizable by the automated alignment system as a global alignment target. The method includes etching a plurality of second vias into the substrate in the second via pattern prior to the thinning of the substrate. The second via pattern is optically recognizable by the automated alignment system as the second alignment target on both the first side and the second side of the substrate after the thinning of the substrate.

In one or more embodiments, the method further includes fabricating a first circuit on the first side of the substrate using the first via pattern and the second via pattern at the first side to align the first circuit, and fabricating a second circuit on the second side of the substrate using the first via pattern and the second via pattern at the second side to align the second circuit.

In one or more embodiments of the method, the first circuit is aligned to the second circuit to within 0.25 micrometers registration accuracy.

In one or more embodiments of the method, the first via pattern in the second side replicates the second via pattern in the first side.

In one or more embodiments of the method, the first via pattern in the second side mirrors the first via pattern in the first side.

In one or more embodiments of the method, each of the plurality of first vias has a diameter in a range of approximately 1 micrometer to approximately 6 micrometers at the first side.

In one or more embodiments, the method further includes supporting the substrate on a handle while thinning the substrate.

A substrate is provided herein. The substrate is fabricated by a method that includes forming a first via pattern in a protective layer on a first side of a substrate. The substrate includes a second side opposite the first side. The first via pattern is a first pixelated version of a first alignment target. The first alignment target is optically recognizable by an automated alignment system. The method includes etching a plurality of first vias through the substrate to the second side in the first via pattern. The first via pattern is optically recognizable by the automated alignment system as the first alignment target on both the first side and the second side of the substrate.

The above features and advantages, and other features and advantages of the present disclosure are readily apparent from the following detailed description of the best modes for carrying out the disclosure when taken in connection with the accompanying drawings.

DETAILED DESCRIPTION

Embodiments of the present disclosure include methods to align targets on both sides of a substrate and a patterned substrate fabricated by the methods. The dual-sided alignment generally provides for improved manufacturing processes for fabricating integrated circuits for three-dimensional integration applications by increasing the registration accuracy of front-side and back-side features. Modern complementary metal-oxide semiconductor (CMOS) devices utilize high-resolution, high-accuracy photolithography processes to define fine-linewidth and finely-spaced front-side features for active devices and passive interconnect structures. Back-side features utilize similar high-precision to interconnect the fine-pitch back-side features with front-side metal layers. Accurate (<0.25 micrometers (um)) registration of front-to-back features is achieved using deep-reactive-ion-etched alignment targets that originate from the front-side and are recognized by production projection lithography steppers on the back-side. The alignment targets are patterned arrays of vias that mimic patterns of standard block/line-design stepper alignment targets (e.g., global television pre-alignment targets and local auto alignment targets). The deep-reactive ion etching produces high height-to-diameter aspect ratio structures (>30:1) capable of spanning a thickness of common substrates (e.g., wafers of approximately 300 um thickness). In various embodiments, the substrate thickness may be reduced using standard thinning processes (e.g., grinding and/or chemical mechanical polishing).

Figure 1:
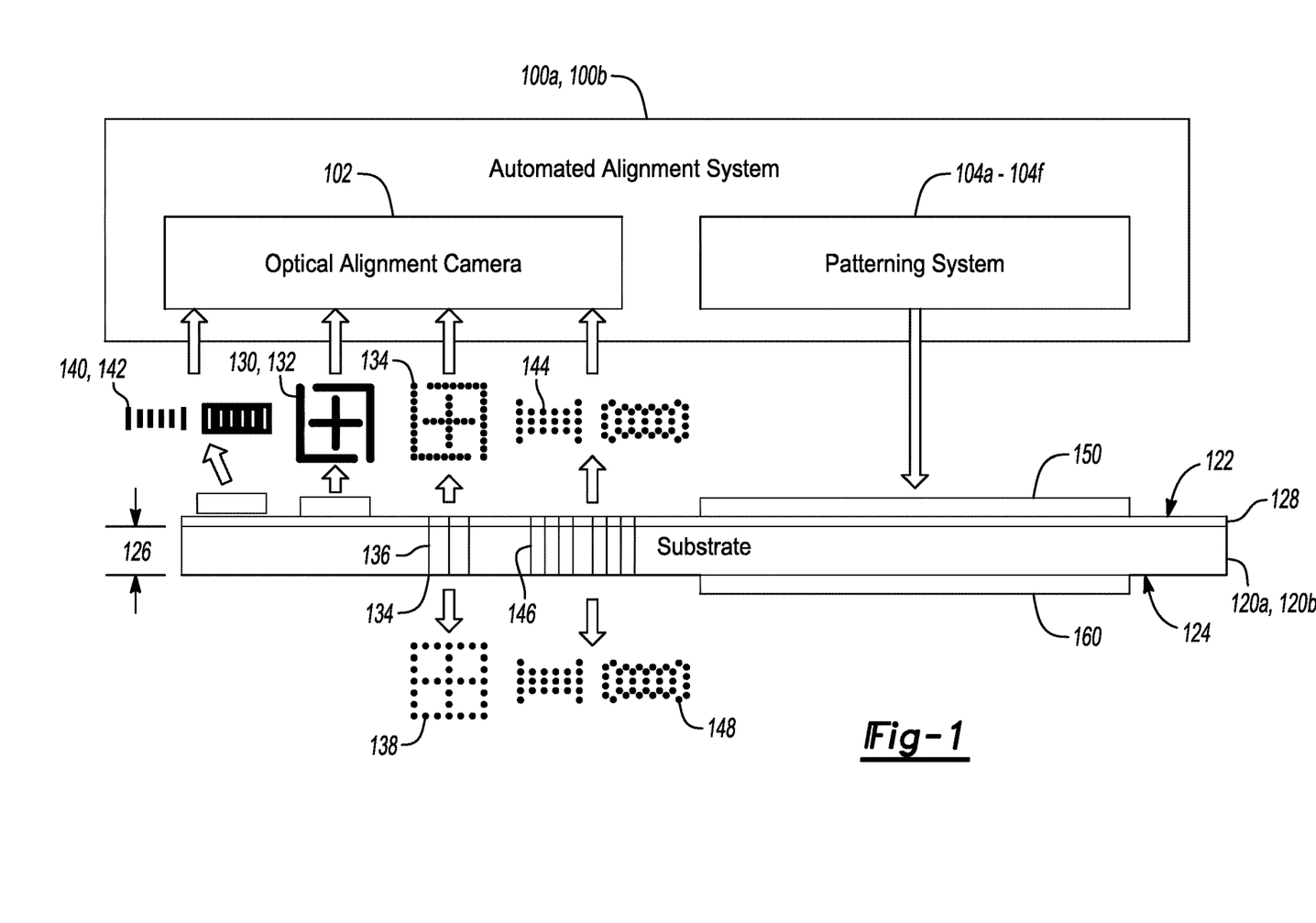
FIG. 1 is a schematic diagram of an automated alignment system in accordance with one or more exemplary embodiments.

Referring to FIG. 1, a schematic diagram of an example implementation of an automated alignment system 100a is shown in accordance with one or more exemplary embodiments. The automated alignment system 100a generally includes an optical alignment camera 102 and a patterning system 104a. The automated alignment system 100a is used to fabricate one or more first alignment targets 130, and one or more optional second alignment targets 140 on a substrate 120a. The substrate 120a may support a first circuit 150 on one side (e.g., a front surface) and a second circuit 160 on an opposing side (e.g., a back surface).

The automated alignment system 100a is operational to provide alignment and photolithography patterning on both sides of the substrate 120a. In various embodiments, the automated alignment system 100a implements an automated lithographic stepper 100b. The automated alignment system 100a may expose photoresists applied to the substrate 120a to patterns that define one or more die (or circuits) at a time.

The optical alignment camera 102 is operational to recognize the first alignment targets 130 and the second alignment targets 140. The optical alignment camera 102 is used to move and/or rotate a relative orientation between the substrate 120a and the automated alignment system 100a to locate the patterning system 104a at an appropriate position on the substrate 120a for an exposure of the photoresist.

The patterning system 104a implements a mechanism that exposes the photoresist applied to the substrate 120a. In various embodiments, the patterning system 104a may be implemented by an e-beam write 104b, contact lithography 104c, imprint lithography 104d, a laser-direct write 104e, a projection stepper 104f, or similar techniques. Early in the production of devices on the substrate 120a, the patterning system 104a is operational to define via patterns for the first alignment targets 130 and the second alignment targets 140.

The substrate 120a implements a semiconductor substrate 120b. The substrate 120a has a first side 122 and a second side 124 opposite the first side 122. The substrate 120 has a thickness 126. The thickness 126 may range from a few tens of microns (e.g., approximately 20 um) to hundreds of microns (e.g., approximately 400 um). The first alignment targets 130, the second alignments targets 140, and the first circuit 150 are fabricated on the first side 122 of the substrate 120a. The second circuit 160 is fabricated on the second side 124 of the substrate 120a.

One or more pixelated versions of the first alignment target 130 are etched into the substrate 120a and extend between the first side 122 and the second side 124. Each pixelated version of the first alignment target 130 form a first via pattern 134. Each first via pattern 134 incudes multiple first vias 136. One or more pixelated versions of the second alignment target 140 are etched into the substrate 120a and extend between the first side 122 and the second side 124. Each pixelated version of the second alignment target 140 form a second via pattern 144. Each second via pattern 144 incudes multiple second vias 146. Formation of the first vias 136 and the second vias 146 is accomplished by etching the first via patterns 134 and the second via patterns 144 in a protective layer 128. The protective layer 128 is generally formed on the first side 122 of the substrate 120a.

The first alignment targets 130 implement television pre-alignment (TVPA) targets. In various embodiments, the first alignment targets 130 are global alignment targets 132. The first alignment targets 130 allow the automated alignment system 100a to globally orient and coarsely align the substrate 120a with the patterning system 104a. Usually, first alignment targets 130 are formed in a thin metal layer deposited either on the protective layer 128 or directly on the first side 122 of the substrate 120a.

Each first via pattern 134 represents a first pixelated version 138 of a first alignment target 130. The first via patterns 134 are collections of the first vias 136 that mimic the first alignment targets 130. The first vias 136 generally have a diameter that matches a line width of the line segments that make up the first alignment targets 130. Therefore, the optical alignment camera 102 recognizes the first via patterns 134 same as the first alignment targets 130.

The second alignment targets 140 implement auto alignment (AA) targets. The second alignment targets 140 may also implement advanced global alignment (AGA) targets. In various embodiments, the second alignment targets 140 are local alignment targets 142. The second alignment targets 140 allow the automated alignment system 100a to finely orient and align the substrate 120a with the patterning system 104a. Usually second alignment targets 140 are formed in the thin metal layer deposited either on the protective layer 128 or on the first side 122 of the substrate 120a.

Each second via pattern 144 represents a second pixelated version 148 of a second alignment target 140. The second via patterns 144 are collections of the second vias 146 that mimic the second alignment targets 140. The second vias 146 generally have a diameter that matches a line width of the line segments that make up the second alignment targets 140. Therefore, the optical alignment camera 102 recognizes the second via patterns 144 same as the second alignment targets 140. The second via patterns 144 are generally located in each reticle location on the substrate 120a. The automated alignment system 100a uses one or a few first via patterns 134 to align the substrate 120a. Subsequently, each reticle has one or more second via patterns 144 for fine alignment.

The deep-reactive ion etching process is an established technology for fabricating high aspect ratio etched structures (>50:1). The aspect ratio prevents via degradation during the etching. Otherwise, the degradation may result in the formation of isolated sections that, when etched through a substrate, become detached from the body of the substrate and so may shift, tile, or break away. Layouts of the first via patterns 134 and the second via patterns 144 lack isolated features, even after extensive etching. The aspect ratio and small taper angles of the vias allow a faithful transfer of patterns between the first side 122 and the second side 124 of the substrate 120a. For typical TVPA targets and AA targets, approximately 1 um to 6 um (e.g., 4.5 um) diameter vias with approximately 4 um to 8 um (e.g., 6 um) separations prove sufficient representation of the first alignment targets 130 and the second alignment targets 140 for a projection i-line Canon lithographic stepper to recognize and utilize the first via patterns 134 and the second via patterns 144 for alignment and orientation. By etching the first via patterns 134 and the second via patterns 144 between the first side 122 and the second side 124, the resulting alignment structures are coplanar with the lithography planes.

To evaluate the front-to-back alignment accuracy, the pixelated TVPA targets were etched from a back-side of a thinned (50 um thick) silicon wafer to pre-existing front-side patterns using the back-side etched pixelated alignment targets transferred from front-side patterns. The alignment accuracy was evaluated using infrared microscopy and scanning electron microscope in combination with focus ion beam (FIB) cross-sectioning analysis of the registration of the TVPA targets originating from the backside of the wafer to front-side contact pads. In each case, the alignment accuracy was shown to be less than 0.25 um.

Figure 2:
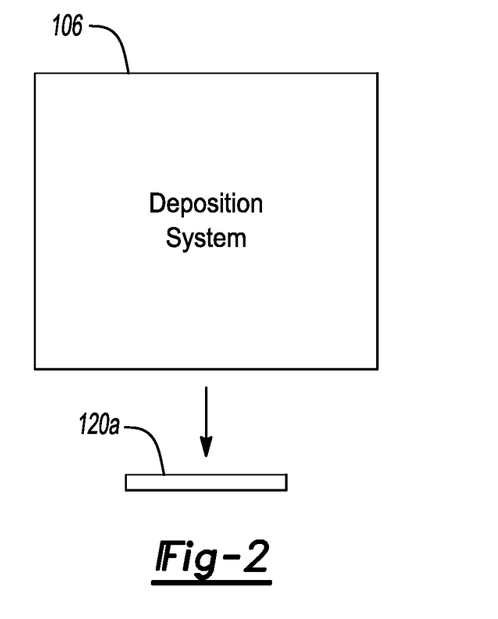
FIG. 2 is a schematic diagram of a deposition system in accordance with one or more exemplary embodiments.

Referring to FIG. 2, a schematic diagram of an example deposition system 106 is shown in accordance with one or more exemplary embodiments. The deposition system 106 is operational to deposit a variety of materials on the first side 122 and the second side 124 of the substrate 120a. The materials may include, but are not limited to, silicon nitride (SiN), aluminum oxide ($Al_2O_3$), platinum (Pt), aluminum (Al), titanium (Ti), gold (Au), tungsten (W), and the like. Other materials may be implemented to meet the fabrication criteria of a particular application.

Figure 3:
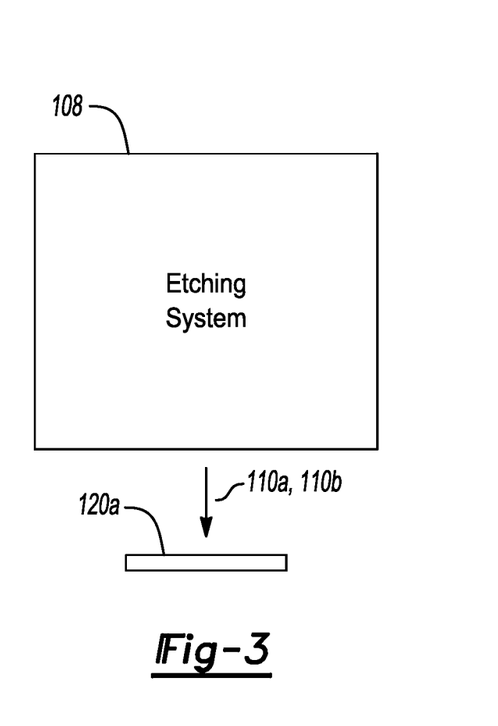
FIG. 3 is a schematic diagram of an etching system in accordance with one or more exemplary embodiments.

Referring to FIG. 3, a schematic diagram of an example etching system 108 is shown in accordance with one or more exemplary embodiments. The etching system 108 is operational to etch 110a (or remove) materials from the substrate 120a. In various embodiments, the etching system 108 may implement a deep-reactive ion etch (DRIE) 110b. Other etching techniques may be implemented to meet the fabrication criteria of a particular application.

Figure 4:
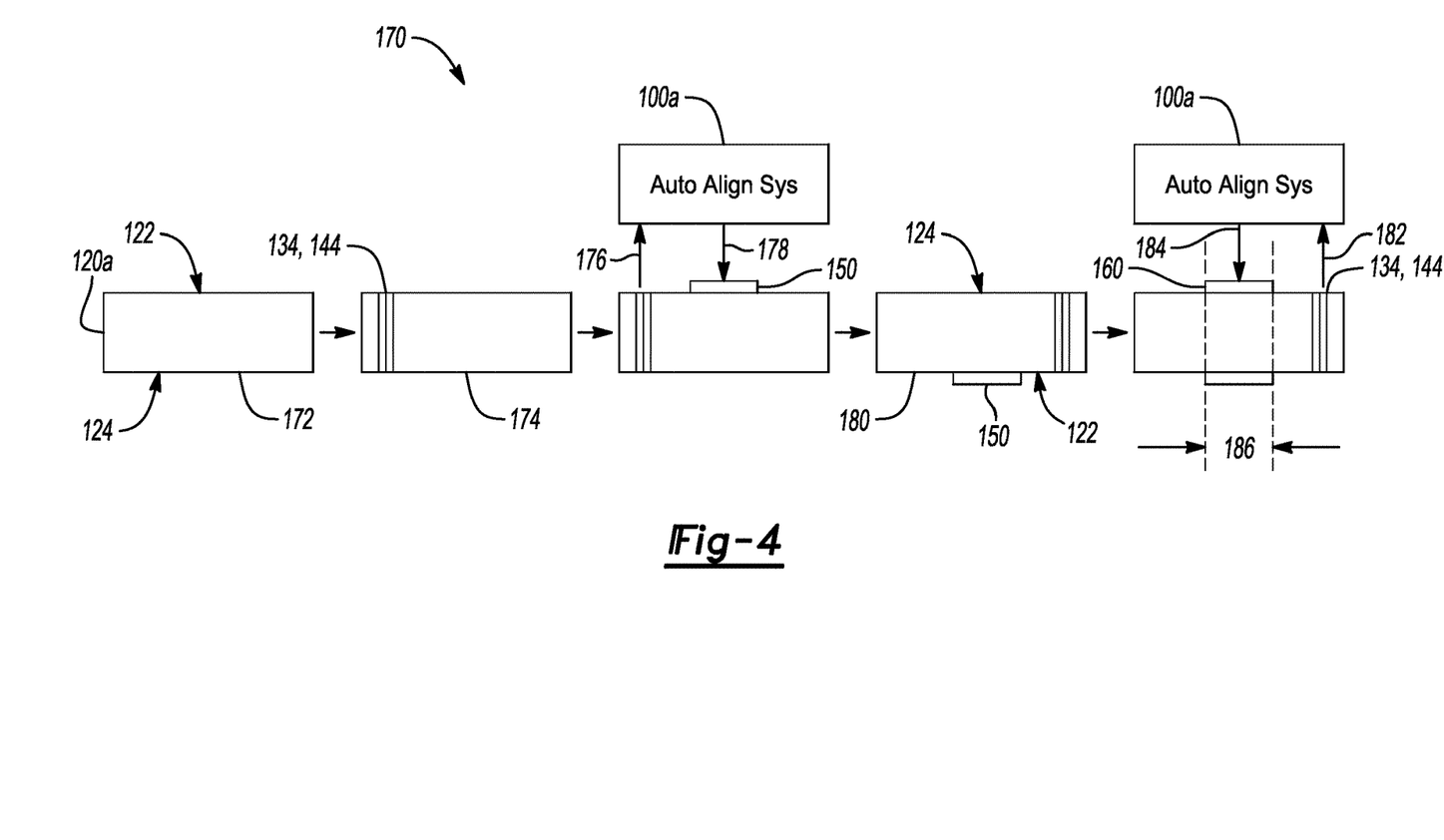
FIG. 4 is a functional flow diagram of a method for fabrication of a dual-sided device in accordance with one or more exemplary embodiments.

Referring to FIG. 4, a functional flow diagram of an example method 170 for fabrication of a dual-sided device is shown in accordance with one or more exemplary embodiments. The method 170 may be implemented using standard semiconductor fabrication equipment and techniques. The method 170 includes steps 172 to 184, as illustrated.

In the step 172, a blank substrate 120a is cleaned. A first via pattern 134 (shown) and an optional second via pattern 144 (not shown) are etched through the substrate 120a in the step 174. The first via pattern 134 extends from the first side 122 of the substrate 120a to the second side 124 of the substrate 120a.

In the step 176, the automated alignment system 100a and the substrate 120a are aligned by the first via pattern 134 visible at the first side 122. The first circuit 150 is formed on the first side 122 in the step 178. Thereafter, the substrate 120a is flipped over in the step 180 so that the second side 124 faces the automated alignment system 100a. If the first via pattern 134 was not etched completely through the substrate 120a, the second side 124 of the substrate 120a may be ground down to expose the first via pattern 134 at the second side 124.

In the step 182, the automated alignment system 100a and the substrate 120a are aligned by the first via pattern 134 visible at the second side 124. The second circuit 160 is formed on the second side 124 in the step 184. By using the first via pattern 134 to align and orient the automated alignment system 100a to the substrate 120a, the first circuit 150 and the second circuit 160 have an alignment 186 to less than half a micron (e.g., <0.25 um).

Several factors contribute to the fidelity of the deep-reactive ion etch fabricated features including: the specific deep-reactive ion etching tool used, the etch recipe employed (e.g., temperature, step timing, etc.), the dimensions of the first vias 136 and the second vias 146, and the spacing of the first vias 136 and the second vias 146. The factors contribute to the aspect ratios of the first vias 136 and the second vias 146. The aspect ratios determine the ultimate useful depth of the vias to establish the back-side alignment targets. The etched alignment targets may be formed either by etching the vias through the substrate 120a, from the first side 122 to the second side 124, with a thickness 126 limitation of approximately 300 um (e.g., based on 6 um diameter vias) or by installing blind vias and subsequently thinning the substrate 120a. The thinning may be performed with the substrate 120a free standing, or mounted on a handle.

Figure 5:
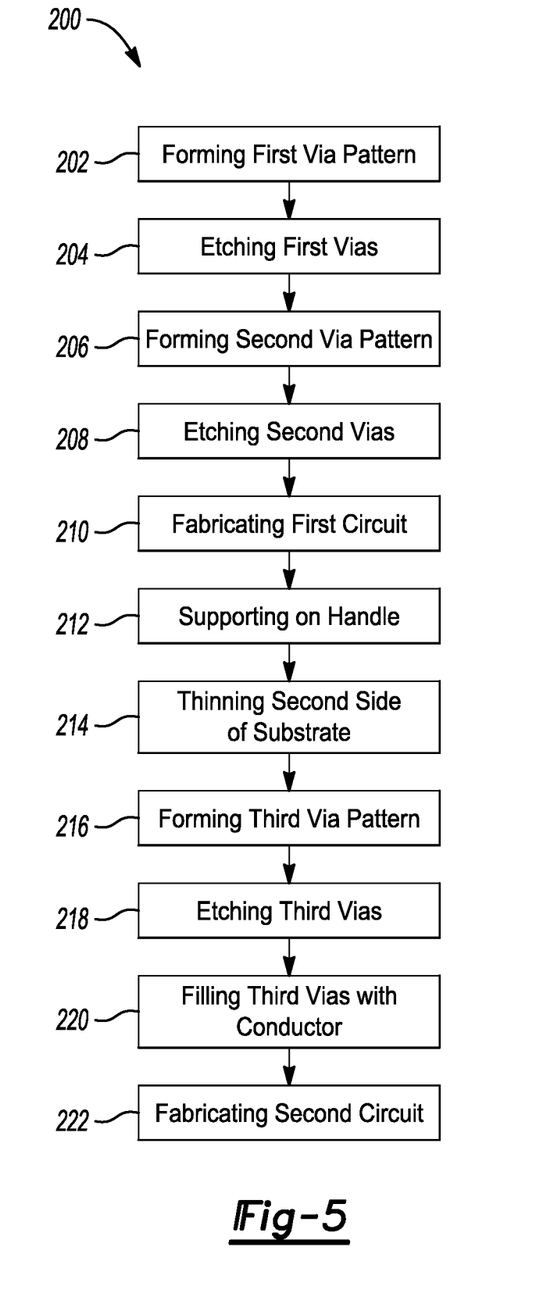
FIG. 5 is a flow diagram of a method to align targets on both sides of a substrate in accordance with one or more exemplary embodiments.

Referring to FIGS. 1 and 5, a flow diagram of an example method 200 to align targets on both sides of the substrate 120a is shown in accordance with one or more exemplary embodiments. The method (or process) 200 is implemented using standard semiconductor fabrication equipment and techniques. The method 200 includes step 202 to 222, as illustrated. The sequence of steps is shown as a representative example. Other step orders may be implemented to meet the criteria of a particular application.

In the step 202, the first via pattern 134 is formed in the protective layer 128 on the first side 122 of the substrate 120a. The first via pattern 134 is a first pixelated version 138 of a first alignment target 130. The first alignment target 130 and the first via pattern 134 on the first side 122 of the substrate 120a are optically recognizable by the automated alignment system 100a as global alignment targets 132. The first vias 136 are arranged in the first via pattern 134 and are etched through the substrate 120a to the second side 124 in the step 204. The first via pattern 134, as viewed from the second side 124, is optically recognizable by the automated alignment system 100a as an additional first alignment target 130 on the second side 124 of the substrate 120a.

In the step 206, the second via pattern 144 is formed in the protective layer 128 on the first side 122 of the substrate 120a. The second via pattern 144 is a second pixelated version 148 of a second alignment target 140. The second alignment target 140 and the second via pattern 144 on the first side 122 of the substrate 120a are optically recognizable by the automated alignment system 100a as local alignment targets 142. The second vias 146 are arranged in the second via pattern 144 and are etched through the substrate 120a to the second side 124 in the step 208. The second via pattern 144, as viewed from the second side 124, is optically recognizable by the automated alignment system 100a as an additional second alignment target 140 on the second side 124 of the substrate 120a. In various embodiments, the first via pattern 134 and the second via pattern 144 are formed and etched concurrently (e.g., the steps 202 and 206 are performed at the same time, and the steps 204 and 208 are performed at the same time).

In the step 210, the first circuit 150 is formed on the first side 122 of the substrate 120a using the first via pattern 134 and the second via pattern 144 at the first side 122 to align the first circuit 150. The substrate 120a may be mounted on and supported by a handle in the step 212 are rotated 180 degrees such that the second side 124 is facing upward.

In the step 214, the second side 124 of the substrate 120a is thinned to reveal the first vias 136 in the first via pattern 134 at the second side 124. Using the first via pattern 134 and the second via pattern 144 on the second side 124 for alignment, a third via pattern may be formed on the second side 124 in the step 216. The third vias are etched through the substrate 120a in the step 218 from the second side 124 to the first side 122. In the step 220, the third vias are filled with a conductor (e.g., a metal). The second circuit 160 is fabricated in the step 222 on the second side 124 of the substrate 120a using the first via pattern 134 and the second via pattern 144 for alignment and orientation. In various embodiments, the conductor in the third via is electrically coupled to both the first circuit 150 and the second circuit 160 to provide communications between the circuitry on both sides of the substrate 120a.

Figure 6:
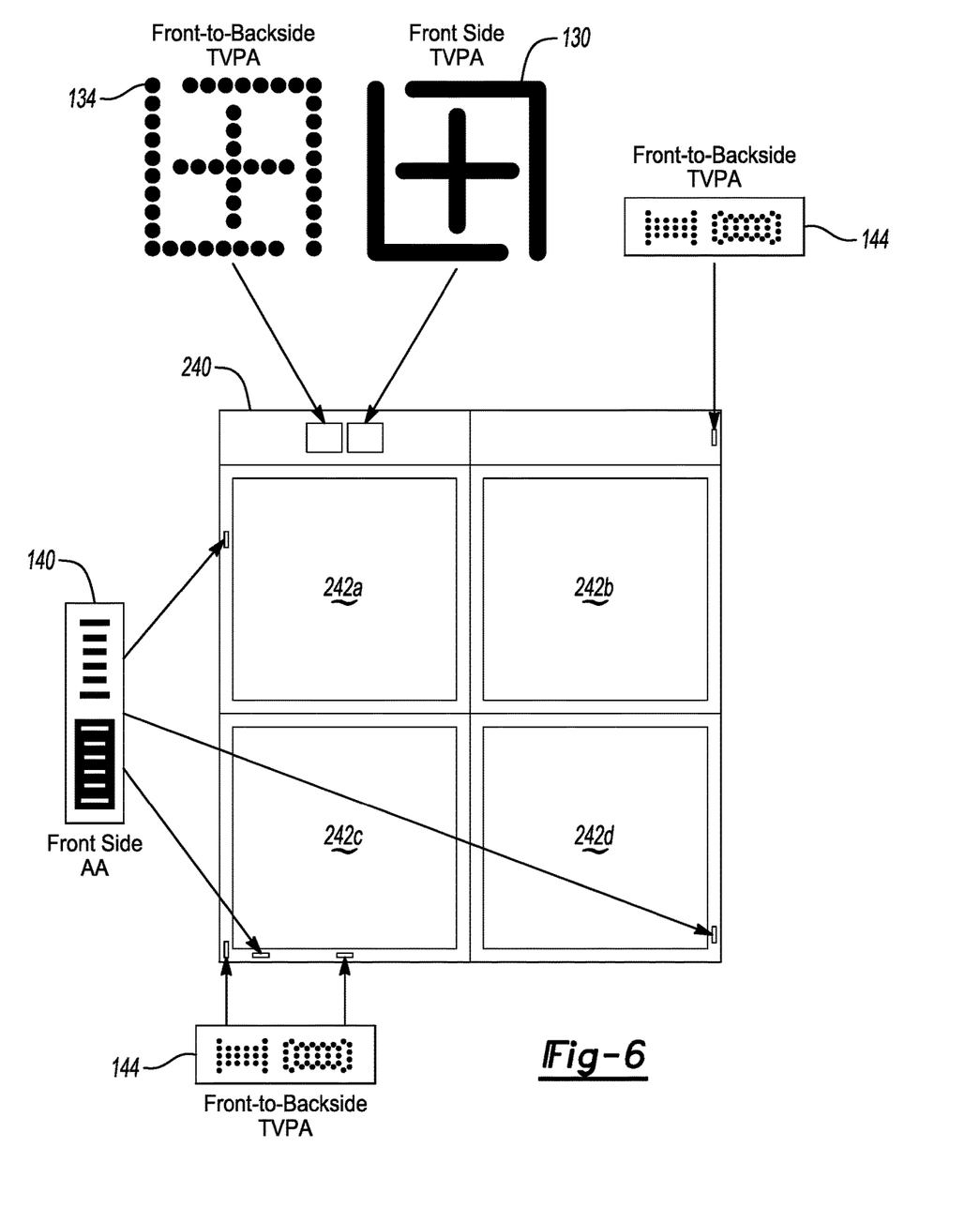
FIG. 6 is a schematic plan diagram of a reticle area on the substrate in accordance with one or more exemplary embodiments.

Referring to FIG. 6, a schematic plan diagram of an example reticle area 240 on the substrate 120a is shown in accordance with one or more exemplary embodiments. The reticle area 240 includes an optional first alignment target 130, a first via pattern 134, multiple optional second alignment targets 140, and multiple second via patterns 144 disposed around multiple (e.g., four) die 242a-242d. In various embodiments, the first alignment target 130 and the second alignment targets 140 may be eliminated where the alignment and the orientation are based solely on the first via pattern 134 and the second via patterns 144.

Figure 7:
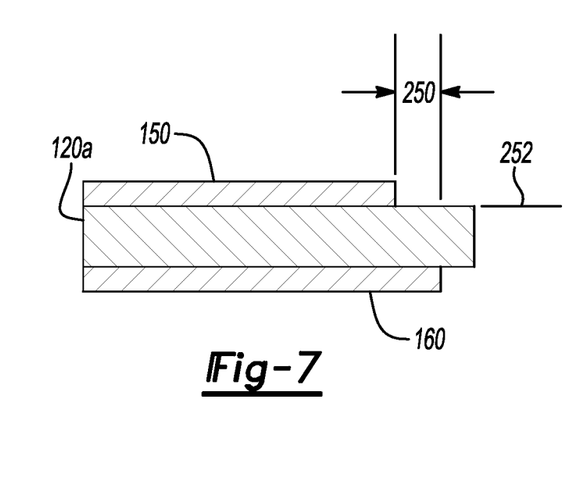
FIG. 7 is a schematic cross-sectional diagram of a registration of a first circuit with a second circuit in accordance with one or more exemplary embodiments.

Referring to FIG. 7, a schematic cross-sectional diagram of an example registration of the first circuit 150 with the second circuit 160 is shown in accordance with one or more exemplary embodiments. Since the first vias 136 and the second vias 146 are essentially perpendicular to the first side 122 and the second side 124, the registration accuracy 250 between the first circuit 150 and the second circuit 160 may be within 1 um (e.g., within less than 0.25 um) in each direction of an X-Y plane 252 of the first side 122.

Figure 8:
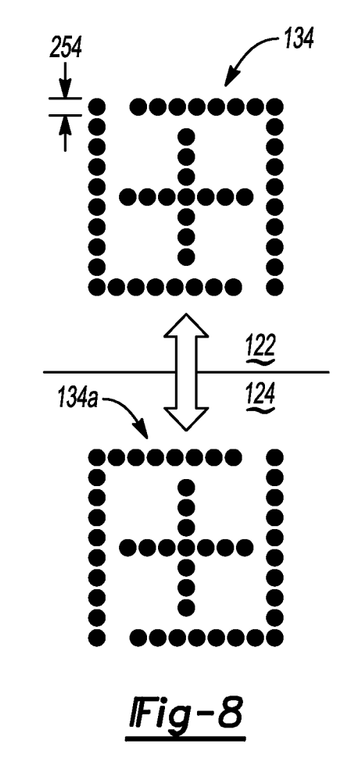
FIG. 8 is a schematic plan diagram of a first via pattern mirrored from a first side to a second side of the substrate in accordance with one or more exemplary embodiments.

Referring to FIG. 8, a schematic plan diagram of an example first via pattern 134 mirrored from the first side 122 to the second side 124 of the substrate 120a is shown in accordance with one or more exemplary embodiments. Etching the first via pattern 134 from the first side 122 through to the second side 124 generally creates a mirrored first via pattern 134a as seen from the second side 124. Therefore, the first via pattern 134 may be designed such that the automated alignment system 100a (FIG. 1) recognizes both the first via pattern 134 and the mirrored first via pattern 134a.

Each first via 136 in the first via pattern 134 has a diameter 254 at first side 122. The diameter 254 may be tailored to meet the substrate thickness 126 and to avoid photoresist issues (e.g., pooling) that may occur for vias that are too large in diameter (e.g., >10 um).

Figure 9:
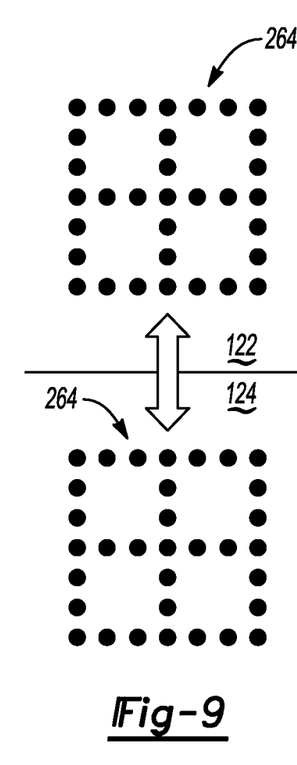
FIG. 9 is a schematic plan diagram of another via pattern replicated from the first side to the second side of the substrate in accordance with one or more exemplary embodiments.

Referring to FIG. 9, a schematic plan diagram of an example via pattern 264 replicated from the first side 122 to the second side 124 of the substrate 120a is shown in accordance with one or more exemplary embodiments. Etching the via pattern 264 from the first side 122 through to the second side 124 generally replicates the via pattern 264 as seen from the second side 124. Therefore, where the via pattern 264 is designed to be optically recognizable by the automated alignment system 100a (FIG. 1) on the first side 122, the same via pattern 264 will be optically recognizable on the second side 124.

Figure 10:
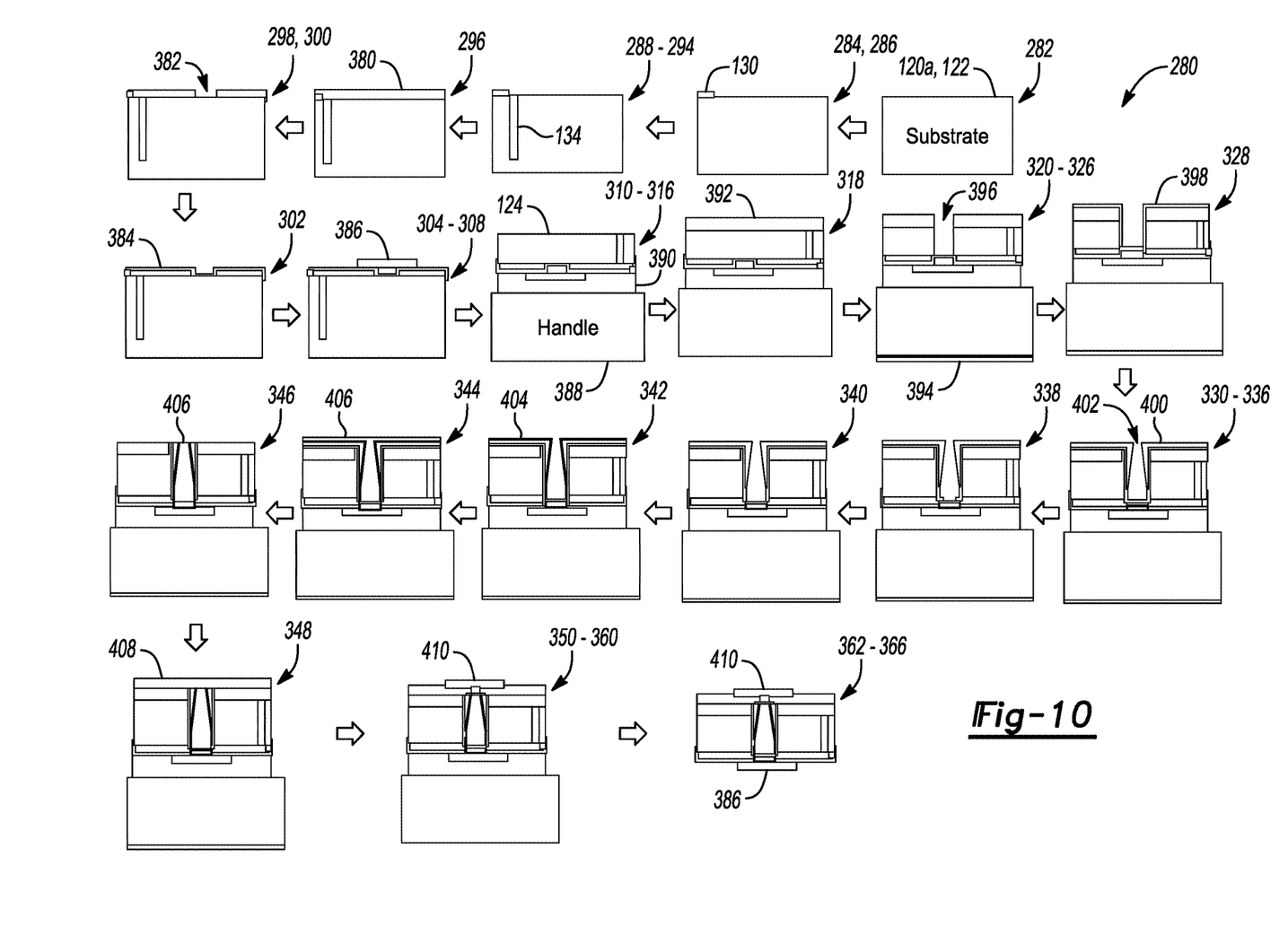
FIG. 10 is a detailed functional flow diagram of a method for the dual-sided device fabrication in accordance with one or more exemplary embodiments.

Referring to FIGS. 1 and 10, a functional flow diagram of an example method 280 for dual-sided device fabrication is shown in accordance with one or more exemplary embodiments. The method (or process) 280 may be performed using standard semiconductor fabrication equipment and techniques. The method 280 includes steps 282 to 366, as illustrated. The sequence of steps is shown as a representative example. Other step orders may be implemented to meet the criteria of a particular application.

In the step 282, the first side 122 of the substrate 120a is prepared for fabrication. A first-side metal layer is deposited on the first side 122 of the substrate 120a in the step 284. The first-side metal layer is patterned in the step 286 to create one or more metal alignment targets (one shown) on the first side 122 in the step 286. A protective layer 128 is deposited over the first side 122 in the step 288.

In the step 290, the automated alignment system 100a (FIG. 1) is optically aligned to the metal alignment target. The first via pattern 134 is formed in the protective layer 128 on the first side 122 of the substrate 120a in the step 292. The first vias 136 are etched in the step 294 through the first via pattern 134 with the deep reactive ion etch into substrate 120a to less than the thickness 126 of the substrate 120a.

In the step 296, a first insulator 380 (e.g., SiO$_2$) is formed on the first side 122. The automated alignment system 100a optically aligns to the first alignment target 130 or the first via pattern 134 in the step 298. Thereafter, the through-substrate pad 382 is patterned in the first insulator 380 in the step 300.

In the step 302, a second insulator 384 (e.g., Al$_2$O$_3$) is deposited (e.g., atomic layer deposition) over the first side 122. Pad metals 386 (e.g., titanium/platinum/gold and copper) are deposited over the second insulator 384 in the step 304. In the step 306, the automated alignment system 100a is optically aligned to the first alignment target 130 or the first via pattern 134. The pad metals 386 are patterned in the step 308 to form through-substrate pads on the first side 122. An edge of the substrate 120a may be subjected to grinding in the step 310 to avoid potential damage during subsequent handling.

In the step 312, the substrate 120a is flipped-over and mounted on a handle 388 with releasing agent 390. The second side 124 of the substrate 120a is ground down in the step 314 to achieve a planned thickness 126. The second side 124 of substrate 120a may be smoothed in the step 316 with a chemical mechanical polishing. In the step 318, a third insulator 392 (e.g., SiN) is deposited on the now-exposed second side 124. A metal (e.g., Al) 394 may be deposited on a back-side of the handle 388 in the step 320.

In the step 322, the automated alignment system 100a is optically aligned to the first via pattern 134 on second side 124 of the substrate 120a. A third via pattern is formed in the third insulator 392 in the step 324. A deep-reactive ion etch is used in the step 326 to cut third vias 396 from the second side 124 through the substrate 120a to the first side 122. A fourth insulator 398 (e.g., Al$_2$O$_3$) is deposited (e.g., atomic layer deposition) on the second side 124 in the step 328. The fourth insulator 398 generally coats the inside walls of the third vias 396 and the pad metals 386. A fifth insulator 400 (e.g., SiN) is deposited in the step 330 over the fourth insulator 398. The fifth insulator 400 may cover the openings and reach partially to completely down the third vias 396 toward the pad metals 386.

In the step 332, the automated alignment system 100a is optically aligned again to the first via pattern 134 on second side 124 of the substrate 120a. Apertures 402 are patterned in the fifth insulator 400 in the step 334. The apertures 402 are opened in the fifth insulator 400 by etching in the step 336. The fourth insulator 398 at the bottom of the third vias 396 are cleared from the titanium layer of the pad metals 386 by etching in the step 338. Ion milling may be used in the step 340 to remove the titanium layer under the apertures 402 to expose the platinum layer. A seed layer 404 (e.g., platinum) maybe sputtered into the second side 124 in the step 342. Thereafter, a conductor 406 (e.g., copper) is plated into the third vias 396 using the seed layer 404 to carry the plating current in the step 344.

In the step 346, excess conductor 406 is removed from the second side 124 of the substrate 120a. The removal may be accomplished by polishing and/or chemical mechanical polishing. A sixth insulator 408 (e.g., SiO$_2$) is deposited (e.g., atomic layer deposition and plasma-enhanced chemical vapor deposition) over the second side 124 in the step 348.

In the step 350, the automated alignment system 100a is optically aligned to the first via pattern 134 on second side 124 of the substrate 120a. The third via pattern is formed again aligned to a top of the conductor 406 in the third vias 396 in the step 352. The sixth insulator 408 and an oxide residue (e.g., copper oxide) on a top surface of the conductor 406 are removed in the step 354. Second-side pad metals 410 (e.g., copper) are subsequently deposited on the second side 124 in the step 356.

In the step 358, the automated alignment system 100a is optically aligned again to the first via pattern 134 on the second side 124 of the substrate 120a. The second-side pad metals 410 are patterned in the step 360. The substrate 120a is released substrate from handle in the step 362. Dies are diced from the substrate 120a with a dicing tool in the step 364. Individual dies are picked from the dicing tool in the step 366.

The techniques disclosed herein achieve high-accuracy front-to-back alignment utilizes etched via patterns that mimic TVPA and AA alignment targets. The etched via patterns may be referenced to front-side metal alignment targets and are defined using a Bosch deep-reactive ion etch process at a depth 5-10% greater than the final target substrate thickness. The etched via patterns comprise small-diameter vias recognized by the automated alignment system. The small-diameter vias also prevent photoresist from flowing into the etched via patterns. The lithography pattern for the etched via patterns may use a 4.5 µm positive resist process that is thick enough to withstand the etching conditions. Development of the photoresist is followed by many (e.g., approximately 170) loops of a Bosch etch recipe designed with parameters to minimize scalloping along the sidewalls. The loops provide the approximately 50 µm of depth that exposes the patterns on the back-side after mounting and thinning the substrate to approximately 40 µm. Front-to-back alignment with etch depths ranging from 20-70 µm and alignment accuracy of ±0.2 µm for subsequently etched back-side to the front-side metal pad arrays have been successfully fabricated.

The techniques allow the utilization of high-resolution stepper photolithography tool capabilities (e.g., 80 nanometer overlay accuracy and 0.7 um linewidth resolution) for defining fine-scale front-side features and back-side features, and a high-accuracy registration of the front-side features with the back-side features. The enhanced registration accuracy reduces keep-out regions and allows fine-pitch and dense integration from the back-side of modern CMOS integrated circuits.

The through-substrate vias are arranged to mimic and substitute for standard block-figure AA targets and TVPA targets that cannot be used as etched targets due to the creation of unsupported, unstable structures. The through-substrate via alignment targets are approximately the same size as standard stepper alignment targets and thereby have little impact on the area use of fine-pitch back-side contact designs. The fine-dimension vias patterns have few photoresist coatings issues (e.g., non-uniformities, pooling, etc.). The techniques have been demonstrated to be straightforwardly integrated into several foundry processes without issue. The techniques do not utilize front-side access (e.g., as in the case of mounted wafers) to align back-side features to front-side landing metal sites.

This disclosure is susceptible of embodiments in many different forms. Representative embodiments of the disclosure are shown in the drawings and will herein be described in detail with the understanding that these embodiments are provided as an exemplification of the disclosed principles, not limitations of the broad aspects of the disclosure. To that extent, elements and limitations that are described, for example, in the Abstract, Background, Summary, and Detailed Description sections, but not explicitly set forth in the claims, should not be incorporated into the claims, singly or collectively, by implication, inference or otherwise.

For purposes of the present detailed description, unless specifically disclaimed, the singular includes the plural and vice versa. The words "and" and "or" shall be both conjunctive and disjunctive. The words "any" and "all" shall both mean "any and all", and the words "including," "containing," "comprising," "having," and the like shall each mean "including without limitation." Moreover, words of approximation such as "about," "almost," "substantially," "approximately," and "generally," may be used herein in the sense of "at, near, or nearly at," or "within 0-5% of," or "within acceptable manufacturing tolerances," or other logical combinations thereof. Referring to the drawings, wherein like reference numbers refer to like components.

The detailed description and the drawings or FIGS. are supportive and descriptive of the disclosure, but the scope of the disclosure is defined solely by the claims. While some of the best modes and other embodiments for carrying out the claimed disclosure have been described in detail, various alternative designs and embodiments exist for practicing the disclosure defined in the appended claims. Furthermore, the embodiments shown in the drawings or the characteristics of various embodiments mentioned in the present description are not necessarily to be understood as embodiments independent of each other. Rather, it is possible that each of the characteristics described in one of the examples of an embodiment may be combined with one or a plurality of other desired characteristics from other embodiments, resulting in other embodiments not described in words or by reference to the drawings. Accordingly, such other embodiments fall within the framework of the scope of the appended claims.

What is claimed is:

1. A method to align targets on opposite sides of a substrate, the method comprising:
    forming a first via pattern in a protective layer on a first side of the substrate, wherein:
        the substrate includes a second side opposite the first side;
        the first via pattern is a first pixelated version of a first alignment target; and
        the first alignment target is optically recognizable by an automated alignment system;
    etching a plurality of first vias through the substrate to the second side in the first via pattern, wherein the first via pattern is optically recognizable by the automated alignment system as the first alignment target on both the first side and the second side of the substrate;
    fabricating a first circuit on the first side;
    etching one or more second vias through the substrate from the second side to the first side;
    filling the one or more second vias with a conductor electrically coupled to the first circuit; and
    fabricating a second circuit electrically coupled to the conductor on the second side.

2. The method according to claim 1, further comprising:
    forming a second via pattern in the protective layer on the first side of the substrate, wherein:
        the second via pattern is a second pixelated version of a second alignment target;
            the second alignment target is optically recognizable by the automated alignment system as a local alignment target; and
            the first alignment target is optically recognizable by the automated alignment system as a global alignment target; and
    etching a plurality of third vias through the substrate to the second side in the second via pattern, wherein the second via pattern is optically recognizable by the automated alignment system as the second alignment target on both the first side and the second side of the substrate.

3. The method according to claim 2, further comprising:
    fabricating the first circuit on the first side of the substrate using the first via pattern and the second via pattern at the first side to align the first circuit; and
    fabricating the second circuit on the second side of the substrate using the first via pattern and the second via pattern at the second side to align the second circuit.

4. The method according to claim 3, wherein the first circuit is aligned to the second circuit to within 1 micrometer registration accuracy.

5. The method according to claim 1, wherein:
    the first via pattern is formed by a deep-reactive ion etch; and
    the automated alignment system is an automated lithographic stepper responsive to the first via pattern.

6. The method according to claim 1, wherein the first via pattern is formed by one of an e-beam, a contact lithography, an imprint lithography, a laser-direct write, and a projection stepper.

7. The method according to claim 1, wherein the first via pattern in the second side replicates the first via pattern in the first side.

8. The method according to claim 1, wherein the first via pattern in the second side mirrors the first via pattern in the first side.

9. The method according to claim 1, wherein each of the plurality of first vias has a diameter in a range of approximately 1 micrometer to approximately 6 micrometers at the first side.

10. The method according to claim 1, wherein the substrate is a semiconductor substrate.

11. A method to align targets on opposite sides of a substrate, the method comprising:
    forming a first via pattern in a protective layer on a first side of the substrate, wherein:
        the substrate includes a second side opposite the first side, and a thickness;
        the first via pattern is a first pixelated version of a first alignment target; and
        the first alignment target is optically recognizable by an automated alignment system;

etching a plurality of first vias through the first via pattern into the substrate to less than the thickness of the substrate; and thinning the second side of the substrate to reveal the plurality of first vias in the first via pattern at the second side, wherein the first via pattern is optically recognizable by the automated alignment system as the first alignment target on both the first side and the second side of the substrate.

12. The method according to claim 11, further comprising:

forming a second via pattern in the protective layer on the first side of the substrate, wherein:
the second via pattern is a second pixelated version of a second alignment target;
the second alignment target is optically recognizable by the automated alignment system as a local alignment target; and
the first alignment target is optically recognizable by the automated alignment system as a global alignment target; and etching a plurality of second vias into the substrate in the second via pattern prior to the thinning of the substrate, wherein the second via pattern is optically recognizable by the automated alignment system as the second alignment target on both the first side and the second side of the substrate after the thinning of the substrate.

13. The method according to claim 12, further comprising:

fabricating a first circuit on the first side of the substrate using the first via pattern and the second via pattern at the first side to align the first circuit; and fabricating a second circuit on the second side of the substrate using the first via pattern and the second via pattern at the second side to align the second circuit.

14. The method according to claim 13, wherein the first circuit is aligned to the second circuit to within 0.25 micrometers registration accuracy.

15. The method according to claim 12, wherein the first via pattern in the second side replicates the first via pattern in the first side.

16. The method according to claim 12, wherein the first via pattern in the second side mirrors the first via pattern in the first side.

17. The method according to claim 11, wherein each of the plurality of first vias has a diameter in a range of approximately 1 micrometer to approximately 6 micrometers at the first side.

18. The method according to claim 11, further comprising:

supporting the substrate on a handle while thinning the substrate.

19. A substrate fabricated by a method comprising:

forming a first via pattern in a protective layer on a first side of the substrate, wherein:
the substrate includes a second side opposite the first side;
the first via pattern is a first pixelated version of a first alignment target; and
the first alignment target is optically recognizable by an automated alignment system;

etching a plurality of first vias through the substrate to the second side in the first via pattern, wherein the first via pattern is optically recognizable by the automated alignment system as the first alignment target on both the first side and the second side of the substrate;

fabricating a first circuit on the first side;

etching one or more second vias through the substrate from the second side to the first side;

filling the one or more second vias with a conductor electrically coupled to the first circuit; and fabricating a second circuit electrically coupled to the conductor on the second side.

20. The method according to claim 19, wherein the substrate is a semiconductor substrate.

* * * * *